United States Patent [19]

Ikegawa et al.

[11] 4,431,980

[45] Feb. 14, 1984

[54] ELECTRICAL APPARATUS WINDING

[75] Inventors: Masahiro Ikegawa; Takahiro Daikoku, both of Ibaraki; Wataru Nakayama, Kashiwa; Taisei Uede, Hitachi, all of Japan

[73] Assignee: Hitachi, Ltd., Tokyo, Japan

[21] Appl. No.: 423,447

[22] Filed: Sep. 24, 1982

Related U.S. Application Data

[63] Continuation of Ser. No. 195,107, Oct. 8, 1980, abandoned.

[51] Int. Cl.$^3$ .............................................. H05K 7/20

[52] U.S. Cl. .................................. 336/60; 174/15 R; 361/382; 361/385

[58] Field of Search ............... 361/381, 383, 382, 385, 361/384; 336/55, 57, 60, 185, 207; 174/15 R

[56] References Cited

U.S. PATENT DOCUMENTS 2,783,441 2/1957 Camille ................................ 336/60

2,912,659 11/1959 Foster .................................. 336/60

FOREIGN PATENT DOCUMENTS 298610 5/1972 Austria .

925187 2/1955 Fed. Rep. of Germany .

2316830 10/1972 Fed. Rep. of Germany .

*Primary Examiner*—G. P. Tolin

*Attorney, Agent, or Firm*—Antonelli, Terry & Wands

[57] ABSTRACT

A plurality of winding units each composed of a wire element are serially arranged in the axial direction of the winding between an inner insulating sleeve and an outer insulating sleeve, and vertical cooling paths are formed on opposite sides of each winding unit and horizontal cooling paths are formed between adjacent winding units. The winding units are divided into a plurality of winding sub-units to define a central vertical cooling path therebetween, which central vertical cooling path includes a via flow path and a branch inducing flow path, whereby cooling fluid flows in opposite directions and at substantially the same speed in the horizontal cooling paths along upper and lower surfaces of each of the winding units having the branch inducing flow path. In this manner, the entire winding is uniformly cooled.

6 Claims, 10 Drawing Figures

ELECTRICAL APPARATUS WINDING

This is a continuation of application Ser. No. 195,107, filed Oct. 8, 1980 and now abandoned, which is a continuation of now abandoned application Ser. No. 931,283, filed Aug. 4, 1978.

BACKGROUND OF THE INVENTION

1. Field of the Invention

The present invention relates to an electrical apparatus winding for a transformer, reactor or a superconductive magnet, and more particularly to an electrical apparatus winding wound in disk shape or helical shape to improve cooling effect.

2. Description of the Prior Art

FIG. 1 is a schematic sectional view illustrating an example of a prior art disk-shaped winding for an electrical apparatus such as a transformer and FIG. 2 is a sectional view taken along a line II—II in FIG. 1. As shown in FIGS. 1 and 2, the transformer winding usually comprises a plurality of winding units 5 each composed of a wire element 4 are serially arranged vertically between an inner insulating sleeve 2 and an outer insulating sleeve 3 which are arranged concentrically around an outer circumference of a core 1. Formed between adjacent winding units 5 are horizontally extending cooling paths (hereinafter referred to as horizontal cooling paths) 6 by horizontal duct pieces (not shown), and formed between each of the winding units 5 and the inner insulating sleeve 2 and between each of the winding units 5 and the outer insulating sleeve 3 are inner and outer vertically extending cooling paths (hereinafter referred to as vertical cooling paths) 7 and 8, respectively, by vertically extending linear duct pieces (not shown).

With the cooling paths thus constructed, however, cooling fluid flows as shown by arrows 9 and 10 as the winding units 5 are heated with the result that the flow in the horizontal cooling paths 6 is very slow. As a result, the temperature at the center of each of the winding units 5 rises and may overheat the winding. In order to prevent such overheating, the horizontal cooling paths 6 must be designed larger. This results in the increase of size of the entire winding. FIGS. 3 to 5 show schematic sectional views illustrating other examples of prior art electrical apparatus windings, such as disk-shaped windings for a transformer. The winding structure of FIG. 3 is shown in Japanese Utility Model Application No. 48-50916 (Published Unexamined Utility Model Application No. 49-150303), in which each of the winding units 5 shown in FIGS. 1 and 2 is divided into a plurality of (two in the example shown in FIG. 3) winding sub-units 5*a* and 5*b* to define a central vertical cooling path 11 therebetween, with the remaining portions being identical to the winding structure shown in FIGS. 1 and 2. With this winding structure, temperature at the center of each of the winding units 5 is lowered by the cooling fluid flowing through the central vertical cooling path 11 but the flow of the cooling fluid in the horizontal cooling paths 6*a* and 6*b* defined between the winding sub-units 5*a* and between the winding sub-units 5*b*, respectively, is still very slow like in the case of FIG. 1. Accordingly, the temperature at the center of each of the winding sub-units 5*a* and 5*b* still rises. In order to prevent such temperature rise, the winding sub-units 5*a* and 5*b* may be further divided, but in this case the size of the winding unit 5 increases by a length corresponding to the total width of additional central vertical cooling paths. In addition, the structure of the winding is very much complicated. An alternative approach for the winding structure is shown in FIG. 4 which is disclosed in the Japanese Utility Model Application No. 48-126273 (Published Unexamined Utility Model Application No. 50-69616), in which each of the winding units 5 is divided into a plurality of (two in the example shown in FIG. 4) winding sub-units 5*c* and 5*d* to define a zig-zag vertical cooling path 12 between the winding sub-units 5*c* and the winding sub-units 5*d*, with the remaining portions being identical to the winding structure shown in FIGS. 1 and 2. With the cooling path thus constructed, the cooling fluid having passed through the vertical cooling path 12 in one stage collides against the wider winding sub-unit 5*d* of the next stage winding sub-units 5*c* and 5*d* disposed above said one stage and is divided into horizontal cooling paths 6*c* and 6*d*. However, when the flow rate of the cooling fluid is slow as a whole, the flow rate of the cooling fluid passing through the vertical cooling path 12 is as slow as the flow rate of the cooling fluid passing through the horizontal cooling paths so that the flow rate of the cooling fluid flowing through the horizontal cooling paths 6*c* is lower than the flow rate of the cooling fluid passing through the horizontal cooling paths 6*d*. As a result, the flow stagnates at the horizontal cooling paths 6*c* under the narrower winding sub-units 5*c*, as shown by arrows in FIG. 4 or the flow is slow and unstable at those regions. As a result, the temperature of those portions of the winding which face those regions rises. In order to prevent such temperature rise, the size of the cooling paths must be increased, but this leads to the increase of size of the entire winding. As another approach, a winding structure shown in FIG. 5 is proposed, which is disclosed in the Japanese Utility Model Application No. 28-33702 (Published Examined Utility Application No. 30-5533), in which the entire side surface of the laminated winding units 5 is enclosed by an insulator 13 and each of the winding units 5 is divided into sub-units with a wider spacing 14 and a narrower spacing 15 therebetween, which alternate from winding unit to winding unit, with the remaining portions being identical to the winding structure shown in FIGS. 1 and 2. With the cooling path thus constructed, by virtue of the arrangement of the spacings 14 and 15 the flow of the cooling fluid is divided into flows which pass only along the sides of the winding units 5 and the flows which pass along the upper and lower surfaces of the winding units 5. The cooling fluid flows in the horizontal cooling paths 6*e* at the center portions of the winding units 5 but does not flow in the horizontal cooling paths 6*f* which are encircled by the end portions of the winding units 5 and the insulator 13 and creates eddies. As a result, the winding portions facing those regions may be unduly heated. In order to prevent such heating, the size of the cooling path must be increased but this leads to the increase of the size of the entire winding.

SUMMARY OF THE INVENTION

It is an object of the present invention to provide an electrical apparatus winding which assures a good flow of the cooling fluid through the paths between the winding units thereby to minimize the temperature rise of the winding and uniformly and effectively cool the winding.

A feature of the present invention resides in that a plurality of winding units each composed of a wire element are serially arranged in the axial direction of the winding between an inner insulating sleeve and an outer insulating sleeve, that horizontal cooling paths are formed between adjacent winding units and vertical cooling paths are formed between the respective winding units and the inner insulating sleeve and between the respective winding units and the outer insulating sleeve, and that each of the winding units is divided into a plurality of winding sub-units to define central vertical cooling paths therebetween each of which comprises a via or through flow path which vertically extends through the winding sub-units and branch inducing flow paths whereby the branch inducing flow paths cause the flow in the central vertical cooling path to meander and the cooling fluid flows in opposite directions in the horizontal cooling paths above and below the winding sub-units having the branch inducing flow paths, to enhance the cooling effect to the winding.

DETAILED DESCRIPTION OF THE PREFERRED EMBODIMENTS

Figure 1:
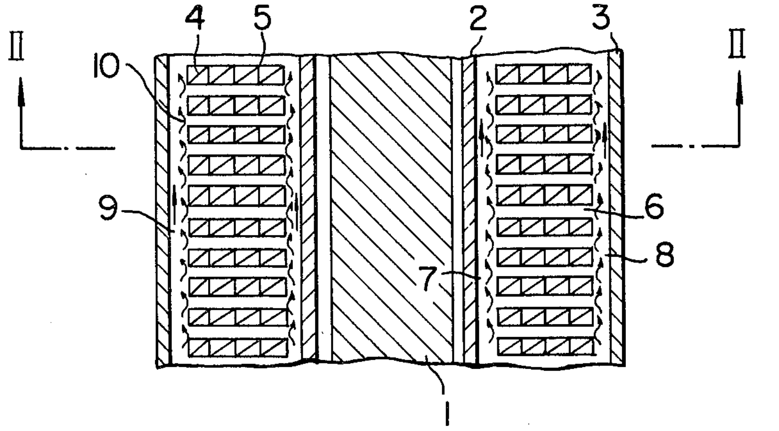
FIG. 1 PRIOR ART
FIG. 1 is a schematic sectional view of a disk-shaped winding for a transformer which shows an example of a prior art electrical apparatus winding.
Figure 2:
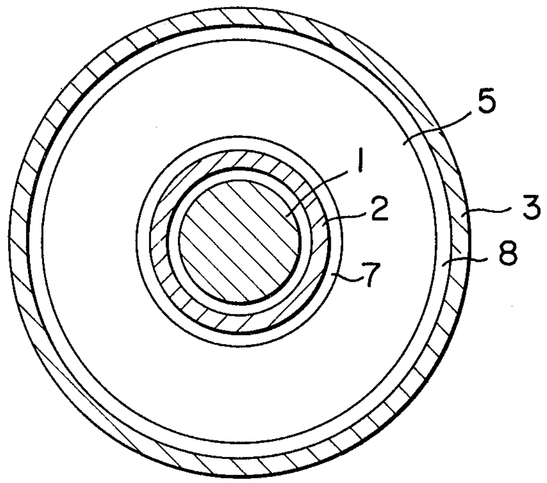
FIG. 2 PRIOR ART
FIG. 2 is a sectional view taken along a line II—II in FIG. 1.
Figure 3:
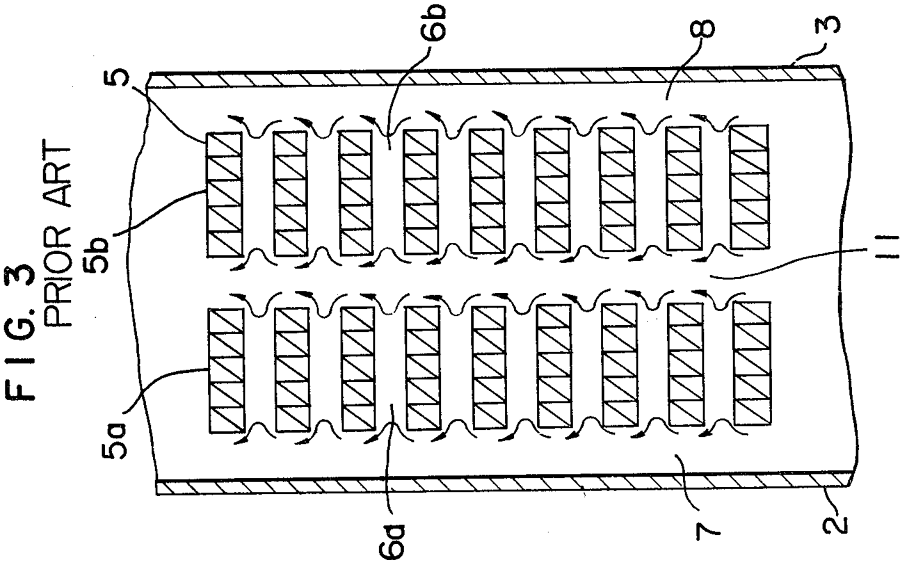
FIG. 3 PRIOR ART
FIGS. 3 to 5 are fragmentary schematic longitudinal sectional views of disk-shaped windings for a transformer which show examples of prior art electrical apparatus windings and in which each of the disk-shaped windings is divided into a plurality of units.
Figure 4:
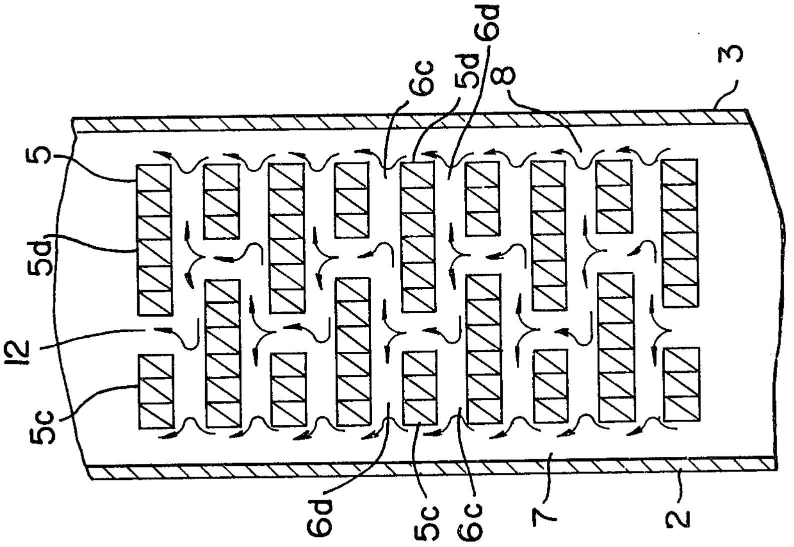
FIG. 4 PRIOR ART
Figure 6:
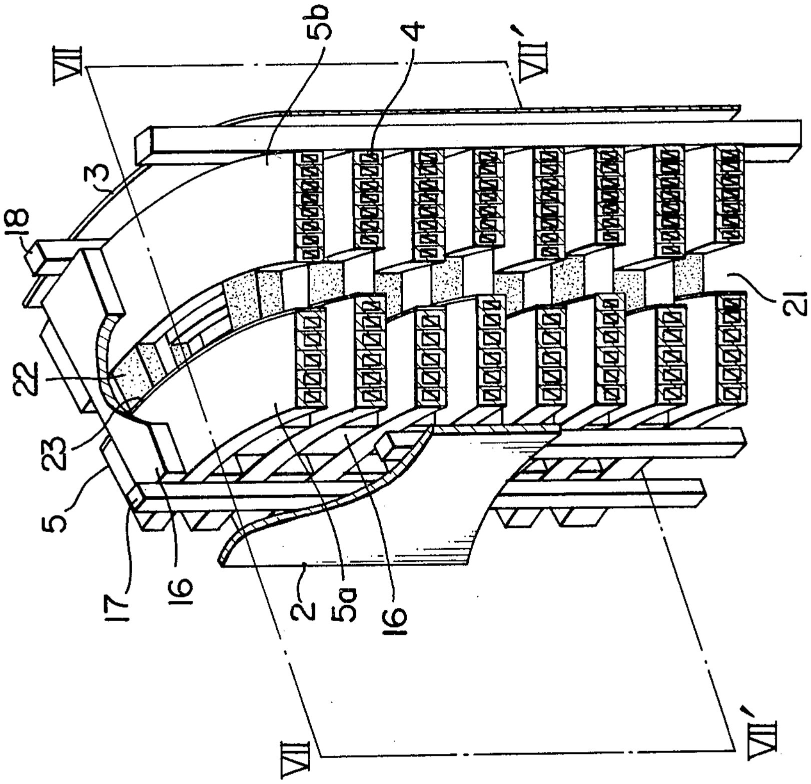
FIG. 6 is a perspective view, partly in section, for illustrating a cooling path structure between windings in a transformer having an electrical apparatus winding in accordance with one embodiment of the present invention.
Figure 5:
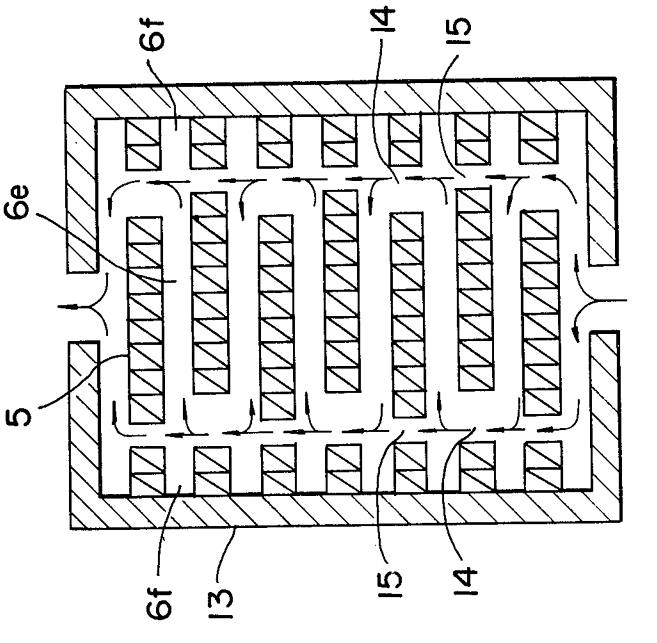
F I G. 5 PRIOR ART
Figure 7:
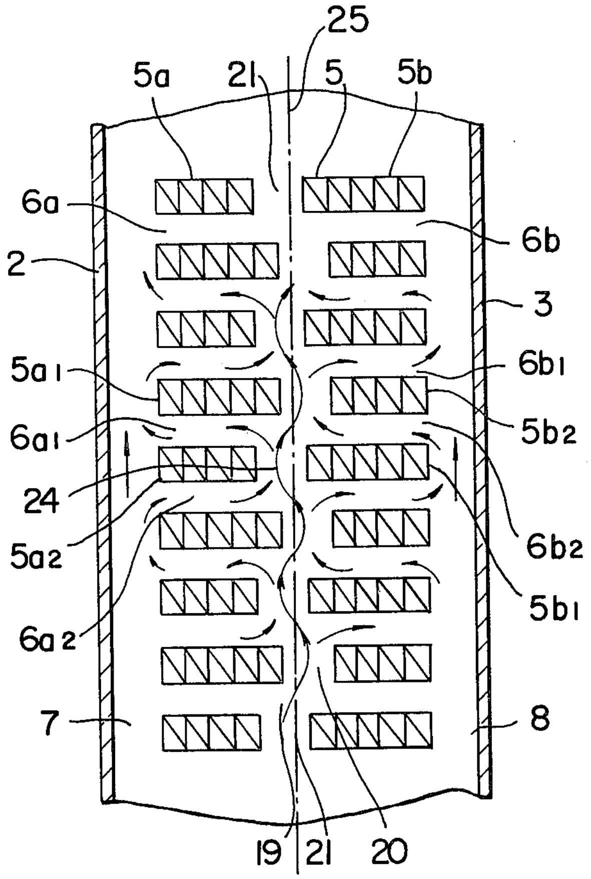
FIG. 7 is a schematic longitudinal sectional view for illustrating flow of the cooling fluid in a sectional plane taken along a line VII, VII—VII', VII' in FIG. 6.
Figure 8:
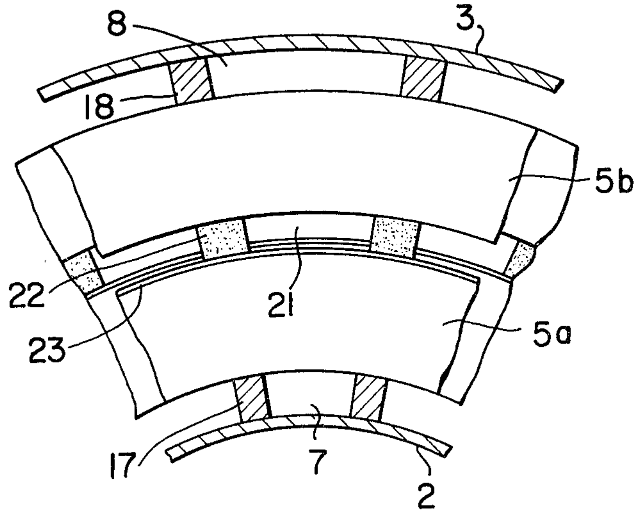
FIG. 8 is a partial horizontal sectional view of FIG. 6.
Figure 9:
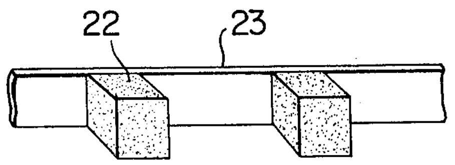
FIG. 9 is a perspective view showing a portion of an interposer which is used to form the winding structure shown in FIG. 6.

Referring to FIGS. 6 to 7, a transformer having an electrical apparatus winding in accordance with one embodiment of the present invention is explained. In FIGS. 6 to 9, the like numerals to those shown in FIGS. 1 to 5 denote like parts. As shown in FIGS. 6 and 7, a transformer winding comprises a plurality of winding units 5, each composed of a wire element 4, arranged serially in vertical direction between an inner insulating sleeve 2 and an outer insulating sleeve 3 which are arranged concentrically around an outer circumference of a core, each of the winding units 5 being divided into two winding sub-units 5*a* and 5*b*. Formed between adjacent winding sub-units 5*a* and between adjacent winding sub-units 5*b* are horizontal cooling paths 6*a* and 6*b*, respectively, by a plurality of horizontal duct pieces 16, with the cooling paths 6*a* and 6*b* being defined circumferentially at equal pitch. Formed between the inner insulating sleeve 2 and the respective winding units 5 and between the outer insulating sleeve 3 and the respective winding units 5 are inner vertical cooling paths 7 and outer vertical cooling paths 8, respectively, by a plurality of inner vertical duct pieces 17 and a plurality of outer vertical duct pieces 18, respectively, with the cooling paths 7 and 8 being defined circumferentially at equal pitch to correspond to the horizontal cooling paths 6*a* and 6*b*, respectively. Also formed between the winding sub-units 5*a* and 5*b* of each of the winding units 5 is a central vertical cooling path 21 which includes a via or through flow path 19 and a branch inducing flow path 20. As shown in FIG. 7, a straight line 25 (in dot-dash form) extending in the vertical direction passes through each winding unit 5 in the space between the winding sub-units 5*a* and 5*b* thereof. The via flow path 19 extends vertically along the path of the straight line 25 through the spacing between the winding sub-units 5*a* and 5*b* and the branch inducing flow path 20 of the central vertical cooling path 21 extends through each winding unit 5 alternately to the left and right of the via flow path 19, from one winding unit to the next winding unit, so that the flow in the central vertical cooling path 21 meanders and a portion of the meandering flow alternately flows into left and right of the horizontal cooling paths 6*a* and 6*b* above the winding sub-units 5*a* and 5*b*. More particularly, where the branch inducing flow path 20 for one winding path 5 is on the right side of the via flow path 19, the branch inducing flow paths 20 for the winding units 5 above and below said one winding unit are arranged on the left side of the via flow path 19. The central vertical cooling path 21 including the via flow path 19 and the branch inducing flow path 20 is formed by winding a band 23 having a plurality of interposes 22 disposed thereon at an appropriate interval, as shown in FIG. 9, with dividing position being staggered from one winding unit to an adjacent winding unit.

Referring to FIG. 7, the flow of the cooling fluid in the winding structure described above is now explained in detail. Since the branch inducing flow paths 20 are arranged alternately on the left and right sides of the via flow paths from one winding unit 5 to the adjacent winding unit 5, meandering flow occurs when the cooling flow (not shown) flows in the central vertical cooling path 21 from the bottom to the top. Although the width of the central vertical cooling path 21 may be different from winding unit to winding unit, strong meandering flow can be produced when the width is uniform. Since the meandering flow 24 flowing through the central vertical cooling path 21 collides against projecting bottom surfaces of those winding sub-units 5*a*1 and 5*b*1 of the winding sub-units 5*a* and 5*b* which project into the spaces above the branch inducing flow paths 20, a portion of the meandering flow 24 passes through the branch inducing flow paths 20 into horizontal cooling paths 6*a*1 and 6*b*1 above winding sub-units 5*a*2 and 5*b*2. On the other hand, the cooling fluid in the horizontal cooling paths 6*a*2 and 6*b*2 below the winding sub-units 5*a*2 and 5*b*2 receives a drag force by a viscosity of the meandering flow 24 so that it flows toward the central vertical cooling path 21. Those induced flows of the cooling fluid which are directed inwardly or outwardly of the horizontal cooling paths 6*a* and 6*b* cool the winding units 5 which they contact and then they merge with a main flow of the cooling fluid which flows vertically upward through the inner vertical cooling path 7, the outer vertical cooling path 8 and the central vertical cooling path 21, to sink the heat. In this manner, the cooling action is repeated. As is apparent from FIG. 7, the sum of the number of turns of the radially spaced winding sub-units 5*a* and 5*b* of a respective winding unit 5 is the same for each of the winding units 5. As shown, the total number of turns of the winding unit is schematically represented as nine turns formed by winding sub-units having five and four turns. By varying the number of turns of the vertically adjacent sub-units, the branch inducing flow paths are formed.

Accordingly, the plurality of winding units 5 which are arranged between the inner insulating sleeve 2 and the outer insulating sleeve 3 can be uniformly and effectively cooled by the combined function of the vertical flow of the cooling fluid which flows through the inner vertical cooling path 7 and the outer vertical cooling path 8, the meandering flow 24 which flows through the central vertical cooling path 21 and the cooling fluid which flows through the horizontal cooling paths 6*a* and 6*b*. Furthermore, since the flow of the cooling fluid which flows through the horizontal cooling paths 6*a* and 6*b* flows in opposite directions along upper and lower surfaces of each of the winding sub-units 5*a* and 5*b*, the winding units 5 can be cooled more uniformly than when it flows in the same direction along the upper and lower surfaces.

Figure 10:
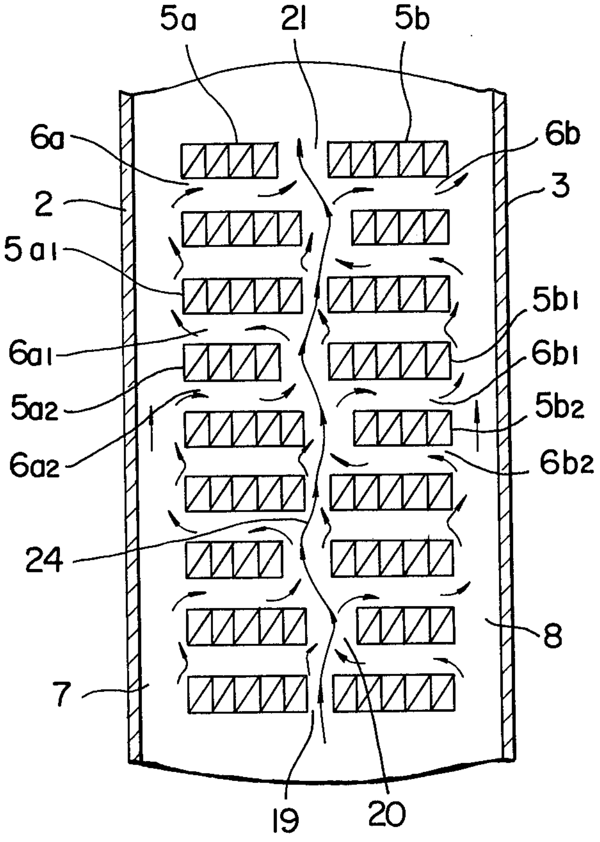
FIG. 10 is a schematic longitudinal sectional view for illustrating a cooling path structure between the windings in a transformer having an electrical apparatus winding in accordance with another embodiment of the present invention.

In another embodiment of the present invention shown in FIG. 10, instead of arranging the branch inducing flow paths 20 for the central vertical cooling path 21 alternately on the left and right side of the via flow paths 19 from one winding unit 5 to adjacent winding unit 5, a winding unit having only the via flow path 19 and no branch inducing flow path 20 is arranged at every third stage. The remaining portions are identical to the embodiment shown in FIGS. 6 to 8. Again, in the present embodiment, by the function of the strong meandering flow 24 of the cooling fluid which flows through the central vertical cooling path 21, the flows of opposite directions can be induced in the horizontal cooling paths 6*a* and 6*b* along the upper and lower surfaces of the winding sub-units having the branch inducing flow paths 20. Although the flow is not induced in the horizontal cooling paths 6*a* and 6*b* between the winding units having only the via flow path 19 and no branch inducing flow path 20, the winding units can be cooled if one of the upper and lower surfaces of each of the winding units is brought into contact with the strong induced flow.

As described hereinabove, according to the present invention, since uniform and stagnation-free flow can be induced in the flow path between adjacent winding units, the heat can be effectively dissipated from the surface of the winding to prevent overheating of the winding. Accordingly, the size and the weight of the electrical apparatus winding and the cooling apparatus can be reduced. In other words, the capacity of the electrical apparatus can be increased.

While the disk-shaped winding has been shown and described in the preferred embodiments of the present invention, it should be understood that similar cooling effect is attainable when the present invention is applied to a helical winding which has a similar cooling structure.

We claim:

1. An electrical apparatus winding comprising a plurality of winding units arranged in a vertical direction between an inner insulating sleeve and an outer insulating sleeve, horizontal cooling paths through which cooling fluid flows, each of said horizontal cooling paths being defined between mutually adjacent winding units, and inner and outer vertical cooling paths through which the cooling fluid flows, said inner and outer vertical cooling paths being defined between said inner insulating sleeve and said winding units and between said outer insulating sleeve and said winding units, respectively, said winding units being divided in the radial direction into winding sub-units which are spaced from one another in the radial direction so that a straight line extending in the vertical direction passes through the plurality of winding units in the space between the winding sub-units thereof, the sum of the number of turns of the winding sub-units of a respective winding unit being the same for each winding unit, central vertical cooling paths being defined by said radially spaced winding sub-units and the vertical arrangement thereof, said central vertical cooling paths being connected to said horizontal cooling paths at an upper side of said winding sub-units and to said horizontal cooling paths at a lower side of said winding sub-units, said central vertical cooling paths each including one via flow path being a substantially straight flow path extending in the vertical direction and defined at least by vertically arranged pairs of said radially spaced winding sub-units and one branch induced flow path defined at least between selected ones of said vertically adjacent winding units along said via flow path, said via flow path extending along the vertically extending straight line, each of the vertically arranged pairs of said radially spaced winding sub-units having respective end portions of said winding sub-units adjacent to and radially spaced in opposite directions from the vertically extending straight line and each of the plurality of pairs of winding sub-units being spaced from each other by the same distance so that the width of said via flow path in the radial direction through each of said winding units is the same, said branch inducing flow path being connected to said via flow path for making said cooling fluid flow such that the flow direction of said fluid flowing in one said horizontal cooling path at an upper side of at least a selected one of said winding sub-units is reversed to the flow direction of said fluid flowing in a vertically adjacent horizontal cooling path at a lower side of the at least selected one of said winding sub-units, said branch inducing flow path for different ones of said winding units being alternately located on the right side and the left side of said via flow path in the vertical direction.

2. An electrical apparatus winding according to claim 1, wherein said winding units are arranged so that said branch inducing flow path for adjacent ones of said winding units is alternately located on the right side and the left side of said via flow path in the vertical direction.

3. An electrical apparatus winding according to claim 1, wherein said winding units are arranged so that said branch inducing flow path for non-adjacent ones of said winding units is alternately located on the right side and the left side of said via flow path in the vertical direction.

4. An electrical apparatus winding according to claim 1, comprising band means having a plurality of interposes, said band means being disposed on at least one of the inner and outer side surfaces of radially adjacent winding sub-units.

5. An electrical apparatus winding according to claim 4, wherein each said interpose has a uniform width in the radial direction so as to maintain the spacing between said winding sub-units and the width of said central vertical cooling paths in all of said winding units uniform, said winding units being arranged so that cooling fluid flows in opposite directions along upper and lower surfaces of each of said winding units having said branch inducing flow path.

6. An electrical apparatus winding according to claim 1, wherein the vertically adjacent winding sub-units have a different number of turns from one another so as to form said branch inducing flow path.

* * * * *